United States Patent
Mao

(10) Patent No.: US 8,133,809 B2
(45) Date of Patent: Mar. 13, 2012

(54) METHOD TO FABRICATE THIN METAL VIA INTERCONNECTS ON COPPER WIRES IN MRAM DEVICES

(75) Inventor: Guomin Mao, San Jose, CA (US)

(73) Assignee: MagIC Technologies, Inc., Milpitas, CA (US)

( * ) Notice: Subject to any disclaimer, the term of this patent is extended or adjusted under 35 U.S.C. 154(b) by 34 days.

(21) Appl. No.: 12/806,381

(22) Filed: Aug. 11, 2010

(65) Prior Publication Data

US 2012/0040531 A1  Feb. 16, 2012

(51) Int. Cl.
*H01L 21/4763* (2006.01)

(52) U.S. Cl. ......... 438/637; 257/E21.577; 257/E21.579; 438/640

(58) Field of Classification Search .......... 438/637–640; 257/E21.577, E21.579
See application file for complete search history.

(56) References Cited

U.S. PATENT DOCUMENTS

| | | | |
|---|---|---|---|
| 6,174,737 B1 | 1/2001 | Durlam et al. | |
| 6,521,542 B1 | 2/2003 | Armacost et al. | |
| 6,777,173 B2 | 8/2004 | Chen et al. | |
| 6,809,028 B2 | 10/2004 | Chen et al. | |
| 6,853,141 B2 | 2/2005 | Hoffman et al. | |
| 6,893,893 B2 | 5/2005 | Nallan et al. | |
| 6,900,596 B2 | 5/2005 | Yang et al. | |
| 7,115,517 B2 | 10/2006 | Ye et al. | |
| 7,122,386 B1 * | 10/2006 | Torng et al. | 438/240 |
| 7,157,415 B2 | 1/2007 | Peyne et al. | |
| 7,335,960 B2 | 2/2008 | Han et al. | |
| 7,804,706 B2 * | 9/2010 | Zhong et al. | 438/3 |
| 2008/0225576 A1 * | 9/2008 | Zhong et al. | 365/158 |
| 2010/0123207 A1 * | 5/2010 | Zhong et al. | 257/421 |

* cited by examiner

*Primary Examiner* — Walter L Lindsay, Jr.

(74) *Attorney, Agent, or Firm* — Saile Ackerman LLC; Stephen B. Ackerman

(57) ABSTRACT

A scheme for forming a thin metal interconnect is disclosed that minimizes etch residues and provides a wet clean treatment for via openings. A single layer interlayer dielectric (ILD), BARC, and photoresist layer are successively formed on a substrate having a copper layer that is coplanar with a dielectric layer. In one embodiment, the ILD is silicon nitride with 100 to 600 Angstrom thickness. After a via opening is formed in a photoresist layer above the copper layer, a first RIE process including BARC main etch and BARC over etch steps is performed. Then a second RIE step transfers the opening through the ILD to uncover the copper layer. Photoresist and BARC are stripped with oxygen plasma and a low DC bias. Wet cleaning may involve a first ST250 treatment, ultrasonic water treatment, and then a third ST250 treatment. A bottom electrode layer may be deposited in the via opening.

20 Claims, 6 Drawing Sheets

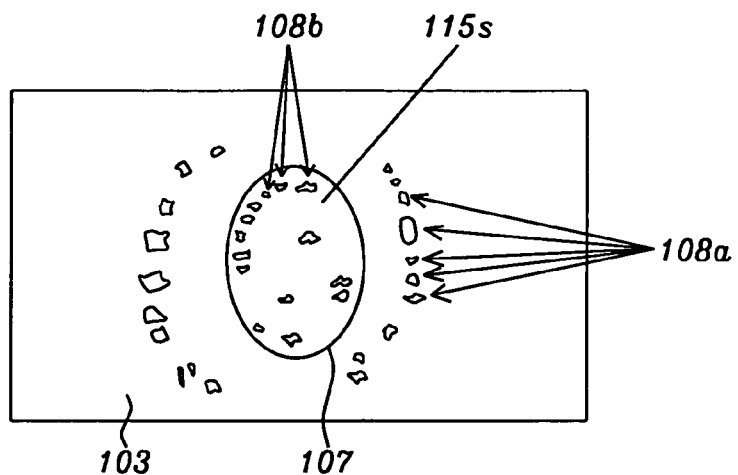
FIG. 1 – Prior Art
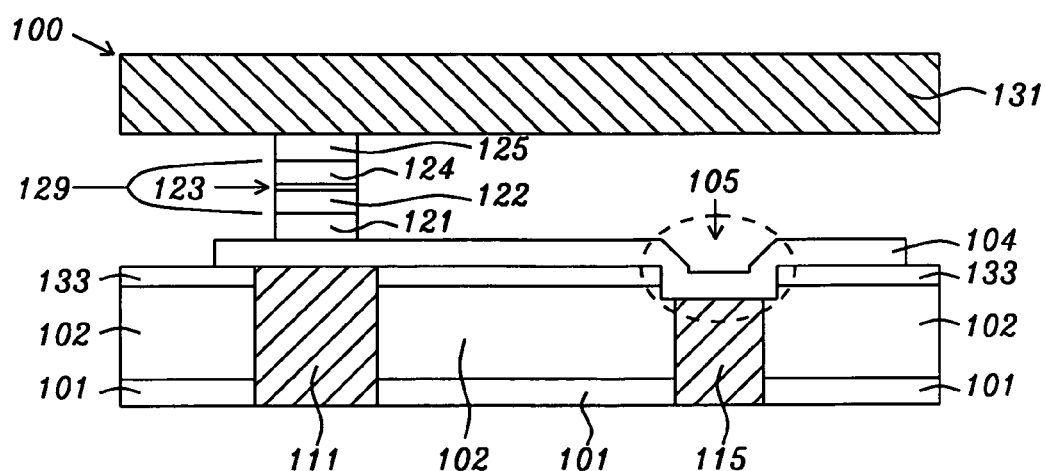
FIG. 2

METHOD TO FABRICATE THIN METAL VIA INTERCONNECTS ON COPPER WIRES IN MRAM DEVICES

FIELD OF THE INVENTION

The invention relates to a method of plasma etching and a post-etch cleaning process to remove etch residues and re-deposited material at an interconnect level such as word line vias formed on copper wires or at other locations where copper metal is exposed to plasma etch processes.

BACKGROUND OF THE INVENTION

Magnetoresistive Random Access Memory (MRAM), based on the integration of silicon CMOS with MTJ technology, is a major emerging technology that is highly competitive with existing semiconductor memories such as SRAM, DRAM, Flash, etc.

A MRAM bit is generally comprised of at least one magnetic tunneling junction (MTJ) cell that consists of a thin tunnel barrier layer made of a non-magnetic dielectric material such as AlOx or MgO that is sandwiched between a set of ferromagnetic layers. One of the ferromagnetic layers is a pinned layer with a magnetization direction fixed by exchange coupling with an adjacent anti-ferromagnetic (AFM) layer. The second ferromagnetic layer is a free layer in which the magnetic direction can be changed by applying external magnetic fields generated by a word line (WL) and bit line (BL). The electrical resistance for tunneling current across the tunnel barrier layer depends on the relative magnetic directions of the pinned and free layers. When the magnetic direction of the free layer is parallel to that of the pinned layer, the resistance across the tunnel barrier layer is low ("0" magnetic state), and when the direction of the free layer is anti-parallel to that of the pinned layer, the resistance across the tunnel barrier is high ("1" magnetic state). Thus, the high and low resistances across the tunnel barrier layer are directly related to the magnetic states of the MTJ cell and this relationship is referred to as a magnetoresistance effect that can be used to store binary information. The arrangement of the free layer above the tunnel barrier layer and pinned layer is called a bottom spin valve configuration. The positions of the free layer and pinned layer (and AFM layer) may be switched such that the free layer is between the tunnel barrier layer and bottom electrode (BE) in a top spin valve configuration.

Typically, there is a plurality of MRAM cells formed in an array on a substrate with a MTJ cell formed at each location where a bit line crosses over a word line. There are other devices including transistors and diodes below the MTJ cell and WL as well as peripheral circuits used to select certain MRAM cells within the MRAM array for read or write operations. Transistors and diodes are typically located about three to five layers below the WL level circuit.

The resistance of the MTJ cell can be altered to either high or low by one pair of the conducting lines below and above the MTJ cell. The conducting line below the MTJ cell is usually referred to as a word line and the conducting line over the MTJ cell is typically called a bit line. The word line level circuit includes two major elements which are a word line to conduct electric current and generate a WL magnetic field, and word line contact (WLC) to connect the MTJ cell to circuits below the WL metal level. Note that the WL and MTJ cell are separated by an insulating layer of dielectric (ILD) that typically is a composite with a lower etch stop layer and a relatively thick dielectric layer above the etch stop layer, but the BL and the MTJ cell are electrically connected through a top electrode. All of the conducting lines and vias are insulated by dielectric layers (ILDs).

The tunneling current provided by the transistors (not shown) formed on a silicon substrate to sense the resistance of a MTJ cell starts at the transistors and flows in the interconnects below the WL layer and into a WLC before passing through an overlying bottom electrode (BE), MTJ cell, and into a BL. A bottom electrode is one of the metal bridges connecting a MTJ cell with the rest of the semiconductor circuits and a second bridge is a top electrode that connects the MTJ cell to an overlying BL. A BE consists of two parts with different morphology. One portion including the region below the MTJ cell is flat and smooth to support good film uniformity in the MTJ cell while another portion is a metal contact inside a via hole called word line via (WLV) that is non-planar and is connected to a WLC to conduct a sensing current.

According to a common sense and basic physics principles, the greater the electric current density in a WL, the stronger the magnetic field generated by the WL, and the easier to change to magnetoresistance in an adjacent MTJ cell. Thus, a proper WL metallization is extremely critical since it must be capable of conducting high density current and used inexpensively within standard IC manufacturing technology. Copper is the best metal to satisfy the aforementioned requirements since it has the second highest electrical conductivity ($59.6 \times 10^6$ S/m) of any element (just below silver) and is relatively cheap. For the sake of convenience and as a cost savings measure, all other conducting elements on the WL level including WLC are made of Cu, too. Since the WL level circuit is metalized with Cu, the ILD between the WL layer and BE not only insulates these two conducting layers, but also functions as a barrier layer to prevent WL copper from diffusing out of metal lines and contacts.

One must also consider that the closer the WL level is to a MTJ cell, the stronger will be the magnetic field generated by the WL on the free layer in the MTJ which makes changing the magnetoresistance state in the MTJ easier to accomplish. Although a WL should be as close as possible to a MTJ cell for ease of switching its magnetic state, a WL should be kept a minimum distance away from the MTJ (and BE) to allow an adequate thickness of ILD to prevent electrical shorting between the conductive elements. An increasing number of advanced MRAM designs require a thinner ILD between WL metal and a bottom electrode than is possible with a composite ILD used in the prior art. An improved ILD must satisfy three conditions which are (1) act as a good insulator to insulate WL metal from a bottom electrode; (2) serve as a good barrier to prevent copper diffusion; and (3) satisfy conditions (1) and (2) as a thin film to maximize the effect of a WL magnetic field on an overlying MTJ.

In an alternative technology called STT-MRAM, a spin-torque (spin transfer) effect is used to switch free layer magnetization instead of WL and BL currents in conventional MRAM. When a spin-polarized current transverses a magnetic multilayer in a current perpendicular to plane (CPP) configuration, the spin angular moment of electrons incident on a ferromagnetic layer interacts with magnetic moments of the ferromagnetic layer near the interface between the ferromagnetic and non-magnetic spacer. Through this interaction, the electrons transfer a portion of their angular momentum to the ferromagnetic layer. As a result, spin-polarized current can switch the magnetization direction of the ferromagnetic layer if the current density is sufficiently high, and if the dimensions of the multilayer are small.

Although conventional methods used to fabricate a WLV in an ILD opening on a Cu surface appear to be straightforward, there are several related issues that can easily lead to low manufacturing yields and device failure in both MRAM and STT-MRAM devices. For example, the Cu metal in the WLC is exposed to ILD etching plasma during an over-etch process and also to oxygen plasma during stripping of photoresist and BARC layers. Unfortunately, the residues created in these plasma processes are harmful to a Cu metal surface in a WLC thereby preventing a high quality WLV interconnection. In FIG. 1, residues and redepositions remaining after WLV etching and photoresist/BARC stripping that expose Cu metal to plasma are illustrated as particles 108a, 108b formed respectively on an ILD 103 and within the edge 107 of a WLV that uncovers a top surface 115s of a WLC. As mentioned in U.S. Pat. No. 7,157,415, if residues from dielectric etching and photoresist/BARC stripping are not cleaned away before the final step of forming openings that expose Cu metal such as when ILD etching to form a WLV is done without completely removing photoresist and BARC, then various residues may be formed on the metal surface and along the sidewall of the opening (via). Residues are usually complicated and contain Cu, CuO, $Cu_2O$, and other materials. A post etch wet cleaning treatment is required to clean various types of etch residues consisting of $CF_x$, $CHF_x$, and the like, Cu, CuO, $Cu_2O$, as well as back sputtered Cu on the dielectric surface and via sidewall. Since typical cleaning solutions containing dilute HF are ineffective in removing copper oxides or $CF_x$ compounds, the persistent copper oxides remain on the substrate and increase via metal resistance.

A prior art reference (U.S. Pat. No. 6,521,542) provides a detailed process for making Cu dual damascene structures where at least two layers of dielectrics are deposited on exposed Cu lines and vias of a prior interconnection level. The dielectric layer contacting exposed Cu in a lower level is used as an etch stop, and a thicker dielectric layer formed on the etch stop serves as the main insulating dielectric in which Cu lines and vias will be formed in the new metal level. All of the etching processes including the main etch through the thick ILD, photoresist and BARC stripping, and removal of filler used to protect the etch stop layer are completed before the thin etch stop layer is etched to expose the underlying Cu interconnect. A common practice as described in this reference and in U.S. Pat. Nos. 7,115,517, 7,157,415, and 6,809,028 is to perform the etch through the thick dielectric with a high DC bias and fast etch rate, strip the photoresist and BARC, and then switch to a lower DC bias and slow etch rate to remove the thin etch stop. Therefore, the photoresist and BARC layers are removed before exposing Cu metal in the lower interconnect to avoid formation of various complex residues as pictured in FIG. 1b.

U.S. Pat. No. 6,174,737 teaches that the ILD should be etched to form windows for depositing a conductor (BE layer) which is used to connect the WLC to a MTJ but there are no suggestions regarding how to etch the patterned ILD or how to resolve issues associated with the etching processes.

U.S. Pat. No. 7,335,960 emphasizes the advantage of forming BL and WL close to the MTJ but the method of achieving this design and related fabrication issues are not disclosed. Therefore, in advanced interconnect structures designed for high performance where copper layers might be exposed to plasma etch chemistries during device fabrication, an integrated method for ILD etching, stripping a photoresist mask, and cleaning is needed so that troublesome residues can be avoided and a high quality WLV to WLC contact can be achieved.

SUMMARY OF THE INVENTION

One objective of the present invention is to provide a process flow for forming a residue free via opening (WLV) in a thin ILD above a word line contact (WLC) that includes a method of forming the via pattern, transferring the pattern through the ILD, and post etch cleaning to ensure that residues are removed from the WLV.

A second objective of the present invention is to provide a single layer of ILD material according to the first objective that is a good insulator for Cu and bottom electrode (BE) metal, can serve as a good Cu diffusion barrier, and can be processed as a thin layer less than about 600 Angstroms thick to enable a strong WL field on an overlying MTJ element.

These objectives are achieved in a MRAM embodiment by providing a substrate comprised of a word line (WL) metal layer that is formed coplanar with a first dielectric layer made of silicon oxide or the like to insulate WL metal lines and contacts (WLC) from each other. A thin ILD about 100 to 600 Angstroms thick is deposited on the substrate and is preferably comprised of silicon nitride or silicon carbide. Above the thin ILD is sequentially formed a bottom anti-reflective coating (BARC) and a photoresist layer. The photoresist layer is patternwise exposed and developed by a conventional method to yield a via pattern in a MRAM array that includes a via aligned over a WLC in each MRAM cell.

Next, a series of reactive ion etch (RIE) steps are used to transfer the via pattern in the photoresist layer through the BARC and thin ILD, and are preferably performed in a dual frequency capacitive etch reactor that can provide independent control of ion energy, plasma density, wafer temperature, and neutral species distribution uniformity. In a first pattern transfer step, a RIE process is performed to transfer the via pattern through the BARC and stops on the ILD. In one embodiment, the BARC etching comprises a main etch and an over etch step. The main BARC etch is comprised of a $CF_4/N_2$ gas flow ratio between 1:1 and 1:4 and stops when an end point is indicated at the fastest etch rate location which may be a large open area in the photoresist pattern, for example. Due to coating non-uniformity, some regions of the photoresist film and BARC may have a slightly greater thickness than others and will take longer to etch. Also, the etch process itself has within wafer non-uniformity such as large openings etching faster than via openings. Thereafter, an over etch step is performed and consists of $N_2$ gas with no fluorocarbon so that the remaining BARC above the ILD (and WLC) is removed with minimal etching of exposed regions of ILD.

Next, the ILD layer above each WLC is removed by a second etch process using a gentle fluorocarbon containing plasma with a slow etch rate. In an embodiment where etching to open a WLV uncovers an underlying WLC and a portion of the adjacent first dielectric layer which is usually an oxide, a selective etch chemistry is required to avoid etching into the dielectric layer. The second etch process typically requires a mixture of $CH_2F_2$ and $O_2$ and has a silicon oxide to silicon nitride etch selectivity of around 4:1 (nitride etches faster than oxide).

In another embodiment, when the WLV opening is smaller than the WLC and etching through the thin ILD does not uncover the first dielectric layer around a WLC, the BARC etch may be combined with the ILD etch. In this case, a combination of $CHF_3$ and $CF_4$ may be employed at a ratio between 0 and 1:6. Preferably, the bias power is below 300 W during the ILD portion of the etch process to form less residue and fewer re-deposits on WLC.

After the WLV is opened by the second RIE process, the photoresist and BARC are removed by an oxygen stripping process that involves oxygen plasma. It is important that the wafer pedestal in the etch chamber is maintained between 10° C. and 40° C. to suppress oxidation of the exposed Cu on the WLC surface. A low DC bias, high chamber pressure, and no magnetic field are the preferred conditions during the oxygen stripping step to minimize residues. Moreover, the amount of over etch time after end point detection is minimized to prevent residue buildup.

No matter how many precautions are taken during the ILD etching and photoresist/BARC stripping steps, there are always a certain amount of RIE residues which means a wet clean treatment is necessary. A typical dual damascene clean comprised of a ST250 wet clean followed by de-ionized water is usually not effective in the present invention. In an embodiment where the usual ST250 wet clean and DI water rinse does not completely remove residues, an alternative cleaning sequence is employed and includes a first ST250 wet clean, a Megasonics (ultrasonic) treatment in water, a second ST250 wet clean, and finally a DI water rinse.

Thereafter, the cleaned WLV and WLC surface is ready for the following step which may be a metallization or deposition of a BE layer. In another embodiment, the BE layer and MTJ stack of layers are sequentially deposited on the ILD and in the WLV followed by a conventional process sequence in which the MTJ stack is selectively removed except above the WL where a MTJ element is formed. Furthermore, portions of a continuous BE layer may be etched to leave a pattern with a bottom electrode in each MRAM cell in which the BE layer partially fills the WLV.

BRIEF DESCRIPTION OF THE DRAWINGS

FIG. 1 is a top-down view of a partially completed MRAM cell after a word line via (WLV) is etched in a thin interlayer dielectric (ILD by a conventional method and has residue formed in the WLV and on the ILD surrounding the WLV.

FIG. 2 is a cross-sectional view of a MRAM cell according to the present invention where there is only a thin single layer of ILD separating the WL layer and the BE layer so that a magnetic field generated by current flowing through the WL will be greater on the MTJ free layer than in a structure with a thicker composite ILD.

DETAILED DESCRIPTION OF THE INVENTION

Figure 3:
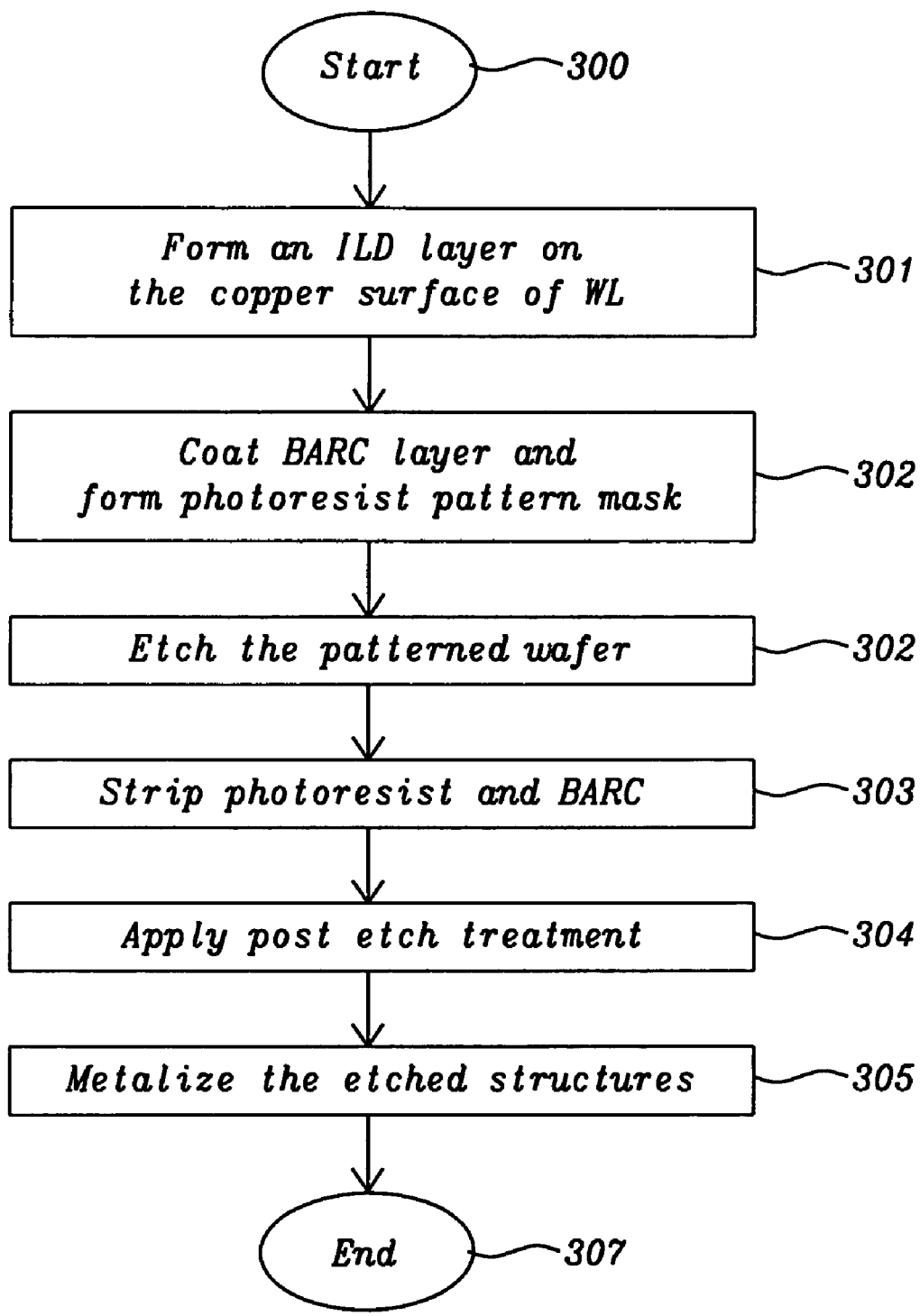
FIG. 3 is a WLV patterning and etching sequence previously practiced by the inventors which leads to considerable residue when employing a thin ILD between the WL metal layer and the BE layer.

The present invention is a process sequence for forming a thin metal interconnect in a MRAM device and teaches how to fabricate small via openings above Cu metal wiring while maintaining high performance and device reliability. It should be understood that the present invention encompasses other MRAM cell designs and metal interconnects besides the structure depicted in the drawings such as STT-MRAM, for example. Although the exemplary embodiment relates to patterning and etching an interlevel dielectric (ILD) above a word line (WL) metal level, those skilled in the art will appreciate that the present invention also applies to other semiconductor fabrication schemes whereby a thin ILD is etched to form an opening that exposes a portion of an underlying Cu layer.

One key feature of the present invention is a thin ILD to separate two metal layers such as a bottom electrode layer and a word line metal layer formed parallel to a substrate and a process sequence for fabricating an interconnect in an opening within the ILD. As mentioned earlier, there are three important requirements for a thin single layer of ILD formed between WL metal and a bottom electrode in an advanced MRAM design. We have found there are only a few dielectric materials such as silicon nitride and silicon carbide that can satisfy the three ILD requirements described previously.

Thinning a prior art ILD comprised of a lower etch stop layer and upper dielectric layer has presented a challenge during fabrication of a WLV 105 where a BE 104 connects with WLC 115 made of Cu wire (FIG. 2). According to an embodiment of the present invention, a composite ILD is replaced by a thin single layer ILD 133 in FIG. 2 in order to shorten the distance between WL 111 and MTJ 129 thereby increasing the WL magnetic field on MTJ 129 during a write process and facilitating the switching of the free layer 124 magnetization direction. MTJ 129 is also depicted with an AFM layer 121, pinned layer 122, tunnel barrier layer 123, and top electrode 125. Typically, silicon nitride with a thickness from 100 to 600 Angstroms is selected as ILD 133 between WL and BE metal layers (i.e. WL 111 and BE 104) although silicon carbide may also be acceptable.

Referring to FIG. 3, a process flow previously practiced by the inventors is outlined to point out some of the yield limiting and reliability issues encountered when fabricating a WLV 105 on a WLC 115 and within a thin ILD 133. The process flow starts at step 300 by providing a substrate and proceeds to step 301 where ILD 133 is formed on the finished WL level circuit and functions as a copper barrier for WL copper before formation of BE 104. In step 302, a layer of bottom anti-reflective coating or BARC (not shown) is coated on ILD 133 and then a photoresist mask (not shown) is coated and patterned on the BARC layer such that openings corresponding in size and shape to the intended WLV are aligned above WLC 115. During step 303, the openings in the photoresist mask are etch transferred through the BARC layer and through ILD 133. Metal WLC wires 115 are exposed to dry plasma etchants during an overetch process and can form metal containing residues similar to particles 108a, 108b depicted in FIG. 1. RIE process conditions used in step 303 usually create a large amount of residue that is difficult to remove and cause reduced yield and reliability problems. In step 304, the remaining photoresist mask and BARC are stripped using oxygen plasma. Care must be taken to prevent oxidation of exposed Cu surface in WLC 115 or electrical resistance will undesirably increase. However, during removal of a large amount of residue produced in step 303, the Cu surface in WLC 115 is exposed to oxygen plasma for a considerable length of time and oxidation is likely to occur. During step 305, a post-etch treatment or wafer cleaning is applied to remove etch residue by-products from the metal WLC 115 and from the unetched surface of ILD 133. In step 306, a BE metal layer is deposited on the patterned ILD 133 to fill WLV 105. Subsequently, the BE metal layer is patterned to generate a bottom electrode (BE) 104 that will provide an electrical connection between WLC 115 and MTJ 129 once the latter is fabricated.

Figure 6:
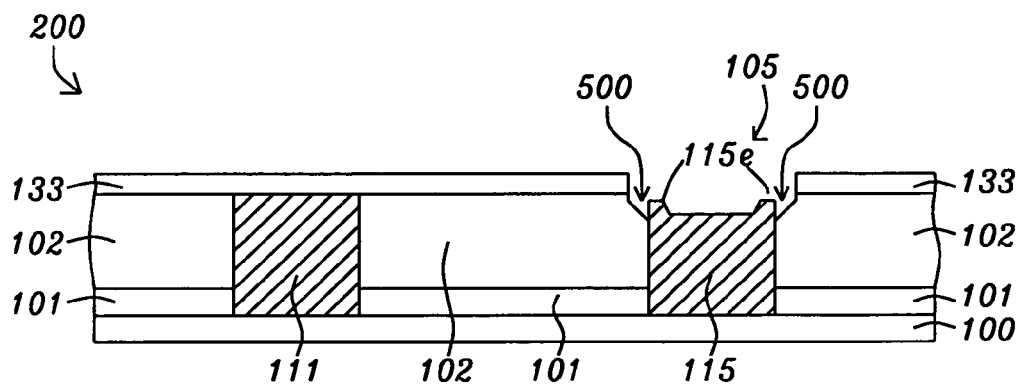
FIG. 6 is a cross-sectional view of a prior art MRAM structure in which WLV etch conditions are used that create trenches around a WLC thereby causing poor device integrity and high resistance after a bottom electrode stack of layers is deposited.

Referring to FIG. 6, the end result of etching an ILD 133 is shown when a prior art ILD etch method that has a non-selective etch step is used to transfer a via opening through an ILD and uncover an underlying copper layer. In other words, the etch rate removal of ILD 133 is not significantly higher than the etch rate removal of ILD 102. The drawing represents the MRAM structure 200 following removal of a composite BARC/photoresist mask by a conventional stripping process. Note that a significant trench 500 is formed around WLC 115 because of the non-selective etch. It is very difficult to fill the narrow and deep trench 500 during a subsequent bottom electrode metal deposition step (not shown) that partially fills WLV 105. Consequently, there is a tendency for the BE layer to break near the edges 115e of WLC 115 and the resulting partial connection between WLC and the BE layer will undesirably increase the resistance of the interconnect.

Returning to FIG. 2, it should be understood that the MRAM structure 100 is part of an MRAM array in which multiple parallel word lines including WL 111 are formed in a first conductive layer below the BE layer 104 and multiple top conductor electrodes including BL 131 are formed in a second conductive layer above an array of MTJs. A MTJ 129 is formed between a bottom electrode 104 and a bit line at a location where BL 131 crosses over a WL 111. MTJ 129 is depicted with a bottom spin valve structure as explained previously but may also have a top spin valve or dual spin valve configuration as appreciated by those skilled in the art. Other parts of the WL metal level such as conduction pads are not shown to simplify the drawing. Alternatively, in a STT-MRAM embodiment, WL 111 is omitted.

Note that BE layer 104 may be a composite of two or more layers and preferably contains at least one metal layer that serves as a conductive layer. After the bottom electrode patterning process is completed (not shown) to form a plurality of bottom electrodes with a BE in each MRAM cell, each MTJ including MTJ 129 will be electrically connected through a BE and a WLC to an underlying transistor.

Figure 4:
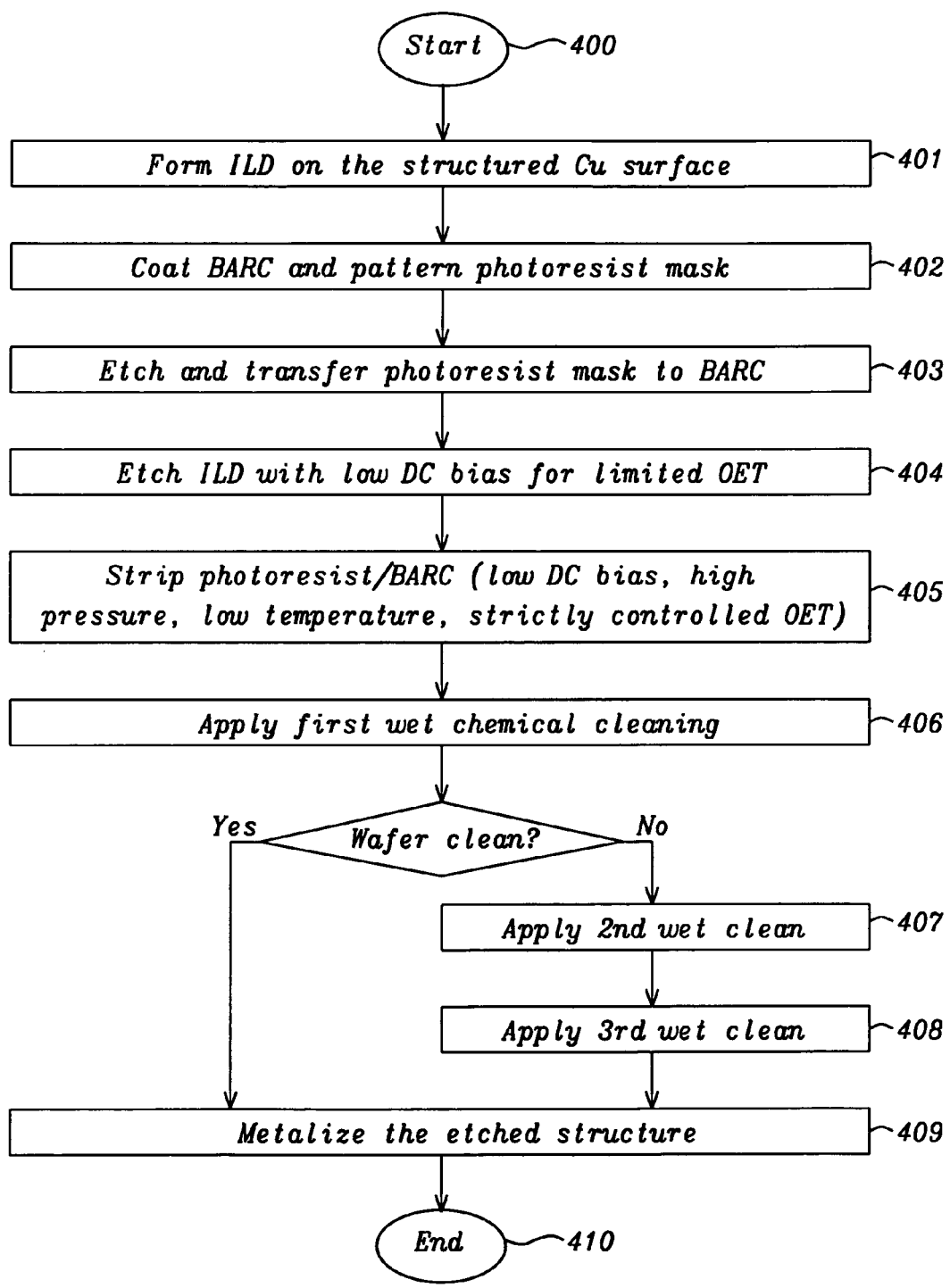
FIG. 4 is a WLV patterning, etching, and cleaning sequence used to form a WLV aligned over a WLC according to a method of the present invention.
Figure 5A:
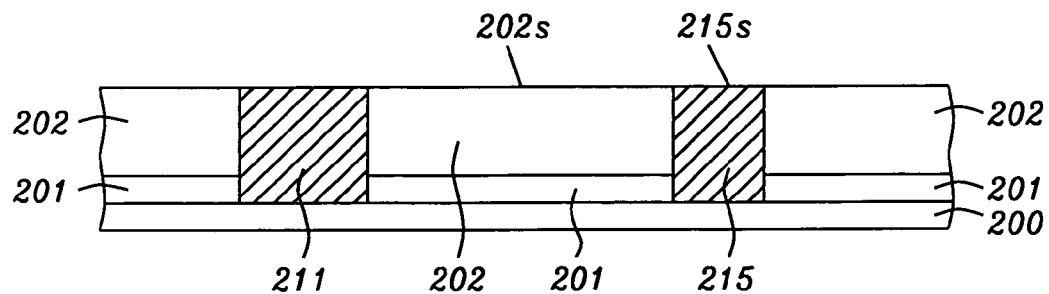
FIGS. 5a-5g are cross-sectional views depicting a WLV patterning and etching sequence in a partially formed MRAM structure according to an embodiment of the present invention.

With regard to FIG. 4, an improved process sequence has been discovered that considerably reduces the issues associated with residue buildup in the earlier process sequence represented in FIG. 3. Various steps in the new process sequence are illustrated with respect to cross-sectional structures in FIGS. 5a-5g. Step 400 (FIG. 4) begins with completion of a WL metal level including WL 211 and WLC 215 formed on a substrate 200 and coplanar with a second dielectric layer 202 (FIG. 5a) made of silicon oxide or the like. Second dielectric layer 202 has a top surface 202s and is formed on a first dielectric layer 201 that may be an etch stop layer, for example. There is a top surface 215s of WLC 215 which is preferably made of Cu. Top surfaces 202s, 215s may be formed along the same plane by a well known chemical mechanical polish (CMP) process which is the final step in a conventional dual damascene technique that forms metal wires in one or more dielectric layers.

Figure 5B:
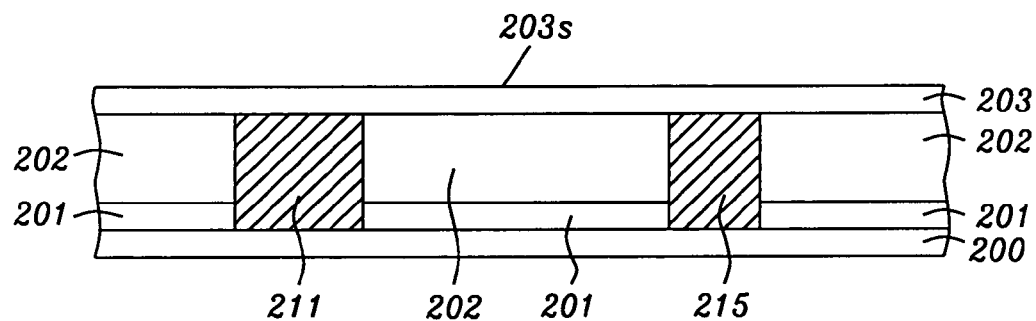

In step 401 (FIG. 4) and in FIG. 5b, ILD 203 is deposited on top surface 215s and on top surface 202s of the second dielectric layer by a chemical vapor deposition (CVD), plasma enhanced CVD (PECVD), or the like. ILD 203 is preferably a single layer of silicon nitride or silicon carbide having a thickness from 100 to 600 Angstroms and with excellent film uniformity to provide a smooth top surface 203s. One tool especially suited for forming a PECVD film is Applied Producer GT from Applied Materials, Inc. Note that no hard mask is used as a protective layer on top surface 203s. Removal of a hard mask at a later step would likely cause uncontrollable ILD 203 thickness and also a rough top surface 203s, both of which would have a negative effect on the performance of a MTJ cell to be fabricated in a subsequent step.

Figure 5C:
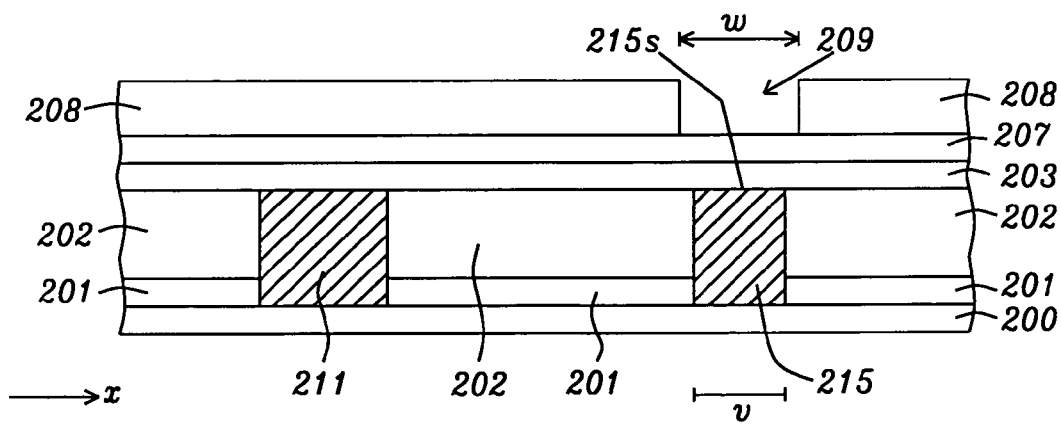

Referring to FIG. 5c and step 402, BARC 207 is formed on top surface 203s typically by a spin coating and baking sequence to generate a dry film generally comprised of a crosslinked polymer with a thickness of around 600 Angstroms and having a high optical density at an exposure wavelength selected to pattern an overlying photoresist layer 208 in a subsequent step. BARC 207 is employed to control the critical dimension w in an overlying photoresist pattern. Thereafter, photoresist layer 208 is formed on BARC 207 with a well known spin coating and baking process and has a thickness of between 1500 and 3500 Angstroms. It should be understood that the thickness of BARC 207 may be modified to give the lowest reflectivity of exposure wavelengths of light off WLC 215s during the following photoresist patterning step to provide improved control of dimension w. Thickness of photoresist layer 208 is adjusted according to the amount of photoresist top loss in later etching steps and is dependent on the dimension w of via openings printed in the patterning step.

During the patterning step, photoresist layer 208 is patternwise exposed and is then treated with an aqueous base solution to remove exposed regions of the film thereby forming arrays of openings that include the via openings to be transferred into ILD 203 in subsequent steps. There are typically other larger openings in the photoresist pattern to assist with alignment, for example, that are not shown. Thus, via opening 209 is formed in photoresist 208 and is aligned above a substantial portion of WLC 215. In one embodiment, dimension w is greater than the width v of WLC 215 in the x-axis direction which is parallel to the planes of the layers in the diagram. However, the present invention also anticipates that in some cases w<v. Furthermore, the center (not shown) of via opening 209 may be offset slightly from the center point of top surface 215s along the x-axis direction.

Figure 5D:
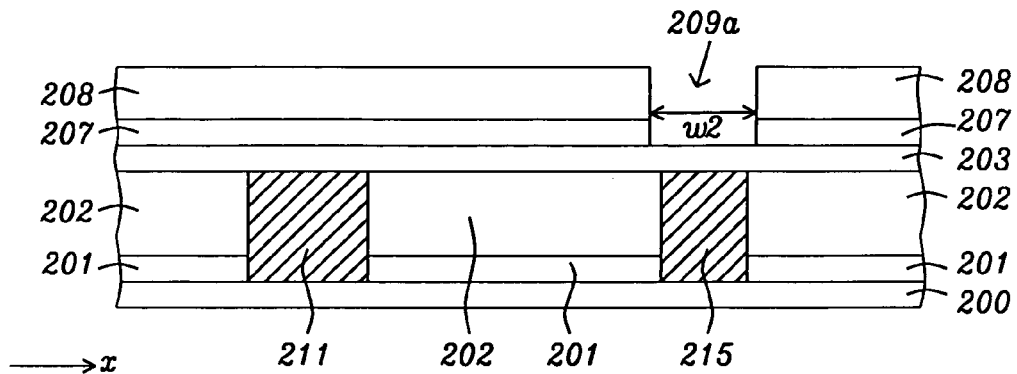

According to the exemplary embodiment of the present invention wherein w>v, and referring to FIG. 5d and step 403 (FIG. 4), via opening 209 in photoresist layer 208 is transferred through BARC 207 by a first reactive ion etch (RIE) process. Preferably, dimension w is retained during the first RIE process but the present invention also anticipates that some etch bias may occur wherein dimension w becomes greater or smaller during the etch transfer through BARC 207. In one aspect, the original dimension printed in photoresist 208 may be adjusted to "w+c" (not shown) when subsequent etch processes decrease the size of the opening by an amount "c" so that via opening 209 with a desired dimension w is generated in ILD 203 above WLC 215.

One tool especially suitable for all RIE processes described hereinafter is an Applied Centura Enabler etch system from Applied Materials, Inc. The Enabler etcher has a very high frequency (VHF) plasma source power supplier (160 MHz, e.g.), a 13.56 MHz cathode bias power supply, and a magnetizing solenoid for generating a magnetic field. Because of its dual frequency capacitive etch capability, the Enabler tool can provide independent control of ion energy, plasma density, neutral species distribution uniformity, and wafer temperature control that are especially useful in fabricating thin interconnects. A more detailed description of the etcher is found in U.S. Pat. No. 6,853,141, and in U.S. Pat. No. 6,900,596.

We have found that a two part BARC etch involving a main etch step to remove a substantial portion of exposed BARC 207 in opening 209 followed by an over etch step with mild etch conditions is needed to minimize the amount of ILD 203 removed adjacent to WLC 215.

Returning to FIG. 5d, the two step etch procedure through BARC 207 according to an embodiment of the present invention begins with a main etch comprising a fluorocarbon such as $CF_4$ at a flow rate of 40 to 120 standard cubic centimeters per minute (sccm), $N_2$ at a flow rate of 40 to 200 sccm, and preferably a $CF_4/N_2$ flow ratio ranging from 1:1 to 1:4. A certain amount of photoresist layer 208 is consumed during the BARC etch and the rate of photoresist loss is reduced by going to a higher $CF_4/N_2$ flow ratio. Other preferred conditions are a chamber pressure between 40 and 120 mTorr, cathode bias power from 200 W to 500 W, 0 to 20 Amps direct current to the solenoids, and a wafer pedestal temperature between 10° C. and 40° C.

To account for non-uniformity in the etching process that causes ILD 203 to be exposed in certain via openings 209a before others, the main etch may be time controlled and terminated at a point when the BARC main etch is expected to reach the ILD at the fastest etch location. Alternatively, the main etch may be stopped at the earliest end point indication. In other words, when an end point signal is indicated by the etch system which means the BARC main etch has reached the top surface 203s in at least a certain number of openings required to produce a detectable signal, then the main etch is terminated so that further BARC main etching does not remove a significant portion of ILD 203 while the remaining via opening 209a is cleared of BARC. It is believed that at least 90% to 95% of BARC thickness is removed in all via openings 209a by the BARC main etch.

At this point, the BARC over etch step begins and removes the remaining BARC 207 in via opening 209a (and other openings not shown) but etches essentially none of the exposed regions of ILD 203 so that ILD uniformity is maintained prior to the ILD etch step. This is an important feature that distinguishes the present invention from a typical damascene process flow where BARC is removed before the final etch to uncover an underlying metal layer. The BARC over etch conditions are the same as the main etch except the fluorocarbon flow rate is set to 0 so that $N_2$ is the only gas flowing in the etch chamber. It should be understood that the BARC main etch defines the desired profile and dimension w2 in via opening 209a and the BARC over etch does not effect the x-directional size or sidewall shape in the via opening. As mentioned earlier, w2 preferably equals w in the original via opening 209 but the process can tolerate some etch bias by adjusting the original x-directional size w in anticipation of a certain amount of via shrinkage or enlargement along the x-axis during subsequent RIE steps.

According to one preferred BARC etch sequence, the BARC main etch comprises $CF_4$ at a 80 sccm flow rate, $N_2$ at a 80 sccm flow rate, 0 Amps direct current to the solenoids, 0 W source power to the upper electrode, 400 W cathode bias power, a chamber pressure of 80 mTorr, and a pedestal temperature of 20° C. which yields a BARC etch rate of about 1200 Angstroms/min. Thereafter, in the same etch chamber, the BARC over etch step comprises $N_2$ at a flow rate of 10 to 400 sccm and preferably 160 sccm, a direct current of 0 to 20 Amps to one or more solenoids and preferably 0 Amps direct current to the solenoids, a source power between 100 W and 3000 W and preferably 150 W to the upper electrode, a cathode bias power from 50 W to 2000 W and preferably 250 W, a chamber pressure between 40 to 120 mTorr and preferably 80 mTorr, and a wafer pedestal temperature between 10° C. to 40° C. and preferably 20° C. In an alternative embodiment, $NH_3$ or $O_2$ may replace $N_2$ during the BARC over etch.

Figure 5E:
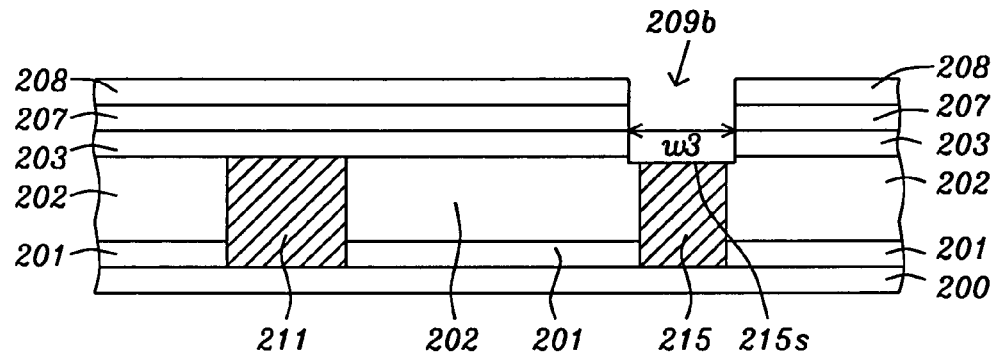

Referring to step 404 (FIG. 4) and FIG. 5e, the next RIE step comprises a gentle fluorocarbon containing plasma that etches exposed regions of ILD 203 in via opening 209a to form a via opening 209b having a width w3 and which uncovers WLC 215. Again, w3 may be essentially the same dimension as w and a bias can be accommodated in the original via pattern to account for any growth or shrinkage in the x-dimension during RIE steps that form via opening 209b. Unlike a typical damascene process flow where photoresist and BARC are removed before the final etch uncovers an underlying metal layer within a dielectric layer, the photoresist/BARC mask is retained during the etch through ILD 203 since there is no other mask available. There may be considerable thickness loss in photoresist layer 208 during this fluorocarbon etching step. In an ideal case, photoresist layer 208 is removed at or near the end of the ILD etching step to minimize the amount of oxygen plasma stripping time required to remove the remaining photoresist mask in the following step.

During step 404, the main etch and over etch are considered as a single step since the same etch conditions may be employed during the entire ILD 203 etch. However, the amount of overetch beyond an end point signal is still minimized by limiting the overetch time to less than about 20 seconds or less than 100% of the main etch time after the end point indication. Overetch time is limited because there is a finite amount of etching of dielectric layer 202 adjacent to WLC 215 and it is desirable to avoid a trench around the WLC as discussed earlier. When silicon nitride is selected as ILD 203 and silicon oxide is used for dielectric layer 202, the etch rate is 4:1 with silicon nitride being removed faster than oxide.

Another important feature of the ILD fluorocarbon etch of the present invention is that the DC bias of the plasma must be kept at a low level along with a small amount of overetch time to minimize the amount of etch residue and redeposited material. DC bias is a combination effect of input power, chamber pressure, and magnetic field strength, and can be reduced by decreasing input power, increasing chamber pressure, or by raising the magnetic field strength. One should also keep in mind that etch rate and etch uniformity must be carefully monitored since they directly affect the amount of overetch, the amount of Cu loss at the top surface of WLC 215, and the loss of dielectric layer 202 adjacent to the WLC.

In the exemplary embodiment, the RIE step through ILD 203 comprises a difluoromethane ($CH_2F_2$) flow rate of 10 to 20 sccm, an Ar flow rate of 80 to 150 sccm, oxygen with a flow rate from 8 to 15 sccm, applying 0 to about 10 Amps direct current to at least one solenoid, a source power between 0 and about 200 W for the upper electrode, a cathode bias power between 200 W and 300 W, a chamber pressure from 25 to 40 mTorr, and a wafer pedestal temperature between 10° C. and 40° C. In a preferred example, ILD 203 has a thickness of around 300 Angstroms and is etched with a process including a 15 sccm $CH_2F_2$ flow rate, a 10 sccm $O_2$ flow rate, a 100 sccm Ar flow rate, 7 Amps direct current to one solenoid, 0 W of source power to the upper electrode, 250 W cathode bias power, a 30 mTorr chamber pressure, and a wafer pedestal temperature of 20° C. The aforementioned conditions provide a silicon nitride etch rate of about 600 Angstroms/minute and a silicon nitride etch rate approximately four times faster than that of silicon oxide in dielectric layer 202. Note that up to about 10 Angstroms of Cu may be removed from the top surface 215s of WLC 215 during the ILD etch step but preferably Cu loss is minimized to prevent residues.

In another embodiment where w<v in via opening 209 (FIG. 5c) and there is no misalignment of the via opening above WLC 215 that would uncover a portion of dielectric layer 202 near the end of the etch process, the BARC etch and ILD etch may be combined in a single etch step since there is no need to be concerned about overetching ILD 203 and creating a trench adjacent to WLC 215. The combined etch recipe comprises one or more of $CF_4$, $CHF_3$, Ar, and $O_2$.

According to one embodiment, the combined etch includes a $CF_4$ flow rate between 40 and 240 sccm and a $CHF_3$ flow rate between 0 and 40 sccm for a $CHF_3/CF_4$ flow ratio from a minimum of 0 to a maximum of 1:6, a chamber pressure from 40 mTorr to 150 mTorr, a cathode bias power from 150 W to 450 W, and a wafer pedestal temperature between 10° C. and 40° C. During a first part of the combined etch through BARC 207, a certain amount of photoresist layer 208 is consumed. As the $CHF_3/CF_4$ flow ratio increases, the amount of photoresist top loss decreases and the taper of the BARC sidewall becomes less vertical or perpendicular to the x-axis.

In a preferred example, the combined BARC 207/ILD 203 etch comprises a 160 sccm $CF_4$ flow rate, a 20 sccm $CHF_3$ flow rate, 0 Amps direct current to solenoids, 0 W source power to the upper electrode, 300 W cathode bias power, a chamber pressure of 60 mTorr, and a wafer pedestal temperature of 20° C. In one aspect, the second part of the combined etch process through the ILD 203 may comprise the same conditions as the first part through BARC 207. Alternatively, a final portion of the combined etch also referred to as the ILD overetch which occurs after an initial end point detect signal is indicated may involve slightly modified conditions where the input or bias power is reduced to the range of 50 W to 200 W to minimize the amount of residues that would otherwise accumulate with a higher DC bias power. Since the aforementioned etch conditions only give a nitride/oxide etch rate of about 1.5:1, the lack of selectivity means the via opening must expose only a top surface of WLC 215 and no dielectric layer 202 adjacent to the copper interconnect.

Figure 5F:
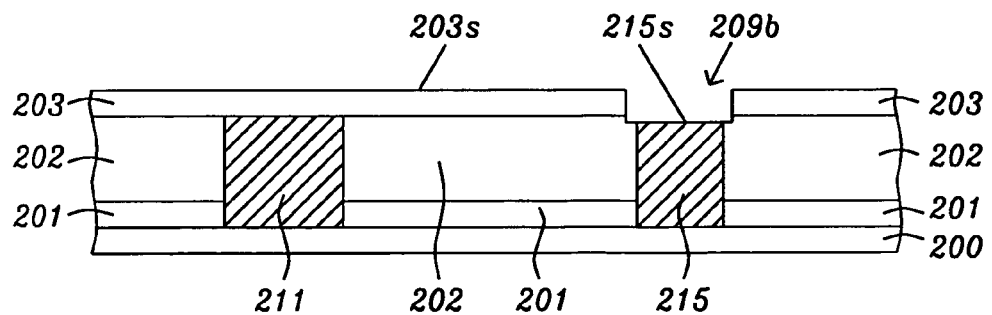

Referring to step 405 (FIG. 4) and FIG. 5f, the remaining photoresist layer 208 and BARC 207 are stripped with an oxygen plasma in an oxygen plasma chamber. One tool that is especially designed for this purpose is an Enabler etcher from Applied Materials, Inc. although other etch tools with a similar capability are acceptable. Since the Cu surface 215s of WLC 215 is fully exposed to oxygen during the stripping process, the wafer pedestal temperature is maintained at a low temperature in the range of 10° C. to 40° C., and the DC bias of the $O_2$ plasma and process time are minimized to prevent oxidation of copper and to reduce metal residues. Over stripping time is kept to a minimum by using an end point detector. Preferably, over stripping time is less than 25% of the time required to reach end point. A certain amount of DC bias is necessary to completely remove the layers 207, 208 and avoid an excessively long stripping time. Furthermore, DC bias is controlled with a high chamber pressure to favor a high recombination rate of the oxygen ions and thereby reduce bombardment of ions at the copper surface and minimize damage thereto. In addition, a magnetic field is not applied to the oxygen plasma since a field would lead to a lower recombination rate of oxygen ions or cause a longer ion lifetime which would increase damage to Cu and form more residues. A magnetic field is also avoided in order to improve stripping rate uniformity and reduce stripping process time. It should be understood that a conventional oxygen stripping process in a damascene scheme where photoresist and BARC are removed before a Cu metal layer is exposed, and where a high 200° C. wafer pedestal temperature is employed to promote oxidation of the organic layers cannot be applied in the present invention.

In a preferred embodiment, the plasma stripping of layers 207, 208 is performed in an Enabler etch module in-situ because the etch tool is equipped with high frequency source power that can generate more plasma ions than standard etchers. The strip process comprises an $O_2$ flow rate of 800 to 1500 sccm, at least one solenoid with 0 to 20 Amps direct current, a source power between 1000 W and 2500 W to the upper electrode, a cathode bias power from 50 W to 200 W, a chamber pressure between 200 and 400 mTorr, and a wafer pedestal temperature from 10° C. to 40° C. In a preferred example that may be used to remove about 2000 Angstroms of photoresist layer 208 and 600 Angstroms BARC 207, the stripping step comprises a 900 sccm $O_2$ flow rate, 0 Amps direct current to the solenoid, 2000 W source power to the upper electrode, 100 W cathode bias power, a 20° C. wafer pedestal temperature, and a chamber pressure of 350 mTorr for an overall etch rate of about 2000 Angstroms per minute.

Since the amount of residue and redeposition generated by the stripping process is directly related to stripping time, the thickness of the BARC/photoresist stack should be as thin as possible after the ILD 203 etch step. Preferably, the photoresist layer 208 is completely consumed near the end of the main ILD etch and as the ILD overetch begins. The remaining BARC 207 is still thick enough to be an adequate mask for the ILD overetch. Moreover, BARC is cleaner than a photoresist in terms of impurities which means stripping BARC usually generates lighter residue on WLC copper than a similar thickness of photoresist. In some cases where a relatively thick photoresist layer 208 remains after the ILD etch step, a trim process involving oxygen plasma may be inserted before the BARC/ILD etch to thin the BARC/photoresist stack and thereby reduce residues during a subsequent stripping step.

We have observed that no matter how much care is taken to optimize the BARC etch, ILD etch, and oxygen stripping steps, there is always a certain amount of residue from metal redeposition or from the plasma itself that requires a wet clean treatment. While a traditional cleaning treatment consisting of a ST250 wet clean followed by DI water rinse is often adequate for damascene schemes or to clean metal (W, Al, or Ni) contacts, the conventional process is typically not sufficient to clean residues from sensitive Cu surfaces that were exposed to fluorine based plasma and $O_2$ based plasma. Thus, the prior art cleaning methods cannot be used to efficiently clean Cu and ILD surfaces exposed as a result of the RIE steps of the present invention.

Another important feature of the present invention is the three step wet cleaning sequence used to remove residues that are otherwise difficult to strip from the surface of Cu wires and ILD (dielectric) surfaces. Referring to step 406 (FIG. 4), a first wet cleaning step is to apply a ST250 solution which may be accomplished in a Capsule chamber of a Raider single wafer processing tool from Semitool Inc., for example. The ST250 solution is applied at a temperature between 35° C. and 45° C. for a period of 2 to 4 minutes. Thereafter, the wafer surface rinsed with DI water, dried with IPA and $N_2$, and then inspected by a scanning electron microscope (CD-SEM) to check for residue. If the particle count falls below a certain specified level, then the wafer is sent directly to step 409 for metallization and avoids further wet cleaning steps. When the particle count during inspection is still unacceptably high, the wafer is sent for two additional cleaning steps indicated as a second wet clean (step 407) and a third wet clean (step 408). All three wet cleaning steps may be performed in the Raider tool.

In step 407, a wafer is immersed in a DI water solution and ultrasonically agitated to loosen the residues from the surface of ILD 203 and WLC 215. This procedure may be performed in a Megasonics capsule of the Raider tool or in another tool with similar capability. A power of 0 W to 200 W may be applied for a period of 1 to 3 minutes. Next, in step 408, the third wet clean procedure comprises a spray application of ST250 for 1 to 3 minutes at a temperature of 35° C. to 45° C. in a Capsule chamber as previously described with respect to step 406. Finally, the wafer is rinsed with DI water and dried by applying isopropanol (IPA) and nitrogen gas. In a preferred example, step 406 comprises a 3 minute wet clean with ST250 at 40° C. in a Type 1 Capsule of Semitool, Inc. followed by a 1 minute ultrasonic clean (step 407) with 200 W power, and then a final wet clean (step 408) with ST250 for 2 minutes at 40° C. in a Type 1 Capsule. Subsequently, the DI water rinse and drying with IPA and $N_2$ result in clean surfaces 203s, 215s of ILD 203 and WLC 215, respectively, such that there is no residue in or adjacent to WLV 209b (FIG. 5f).

Figure 5G:
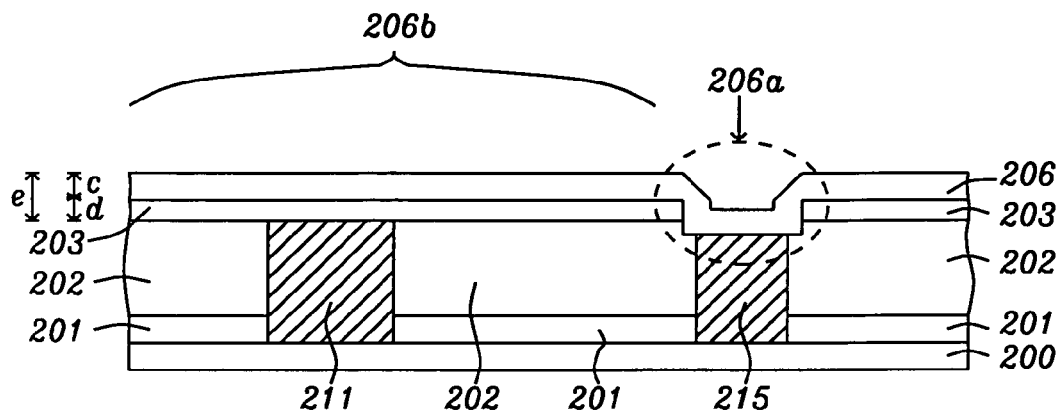

Referring to step 409 (FIG. 4) and FIG. 5g, the fabrication process of the present invention proceeds to a final step of depositing a metal or a BE layer to at least partially fill WLV 209b. The Endura tool from Applied Materials, Inc, or the Anelva 7100 sputter deposition system are examples of tools that may be used for the metallization step 409. In the exemplary embodiment, where a BE layer 206 is laid down on ILD 203 and in WLV 209b to make contact with WLC 215, the BE is comprised of an essentially planar region 206b on which a MTJ will subsequently be formed and a non-planar region 206a that partially fills WLV 209b and contacts WLC 215. Preferably, BE 206 is substantially conformal to the sidewalls of WLV 209b.

The present invention offers an advantage over the prior art in that the distance between a WL metal layer and an overlying MTJ may be reduced to facilitate a write process in which a free layer in the MTJ is switched under the influence of a magnetic field generated by flowing a current through the word line. Therefore, decreasing the thickness e between a WL and MTJ (not shown) by incorporating a thinner ILD layer with thickness d is beneficial in providing a stronger magnetic field on the MTJ free layer. The ILD thickness reduction from a conventional composite layer to a thin single layer of silicon nitride or silicon carbide is accomplished with a unique etch sequence including a BARC etch, ILD etch, and oxygen stripping process as defined in the embodiments of the present invention. The etch sequence as defined herein is not restricted to forming via openings about a word line contact but may be advantageously used to form a opening in a thin dielectric layer above a copper metal layer elsewhere in the device structure. Moreover, etch and cleaning processes of the present invention are beneficial in substantially reducing residue buildup in openings formed over copper layers thereby improving yield and device performance.

While this invention has been particularly shown and described with reference to, the preferred embodiment thereof, it will be understood by those skilled in the art that various changes in form and details may be made without departing from the spirit and scope of this invention.

I claim:

1. A method of fabricating thin metal via interconnects, comprising:
   (a) providing a substrate comprised of a copper layer formed in a first dielectric layer, said copper layer has a top surface that is coplanar with a top surface of the first dielectric layer;
   (b) depositing a thin single layer of interlayer dielectric (ILD) on the substrate;
   (c) sequentially forming a bottom anti-reflective coating (BARC) and a photoresist layer on the ILD;
   (d) forming a pattern in the photoresist layer comprised of a via opening that is aligned above a portion of the copper layer and exposes a portion of a top surface of the BARC;
   (e) performing a first reactive ion etch (RIE) process, comprising:
   (1) a BARC main etch step that removes a substantial thickness of BARC in regions exposed by the via opening; and
   (2) a BARC over etch step that completely uncovers a top surface of ILD aligned below the via opening
   (f) performing a second RIE etch process comprised of a low bias power, a fluorocarbon gas, and an initial end point detect signal thereby removing the ILD below the via opening and uncovering a portion of copper layer and first dielectric layer below the via opening;
   (g) stripping the BARC and any remaining portions of the photoresist layer with an oxygen plasma in an etch chamber with a wafer pedestal temperature, DC bias, and minimum time beyond an end point signal that avoid copper oxidation and damage to copper; and
   (h) performing a wet clean treatment.

2. The method of claim 1 wherein the first dielectric layer is made of silicon oxide and the ILD is comprised of silicon nitride or silicon carbide and has a thickness from about 100 to 600 Angstroms.

3. The method of claim 1 wherein the BARC main etch is comprised of a $CF_4$ flow rate of about 40 to 120 standard cubic centimeters per minute (sccm), a $N_2$ flow rate of about 40 to 200 sccm, a $CF_4/N_2$ flow ratio between about 1:1 to 1:4, a chamber pressure between about 40 and 120 mTorr, a cathode bias power from about 200 W to 500 W, and a wafer pedestal temperature between about 10° C. and 40° C.

4. The method of claim 1 wherein the BARC over etch is comprised of a $N_2$ flow rate from about 10 to 400 sccm, a direct current from about 0 to 20 Amps to one or more solenoids, a source power between about 100 W to 3000 W to an upper electrode, a cathode bias power from about 50 W to 2000 W, a chamber pressure of about 40 to 120 mTorr, and a wafer pedestal temperature between about 10° C. and 40° C.

5. The method of claim 1 wherein the second RIE step comprises a difluoromethane ($CH_2F_2$) flow rate from about 10 to 20 sccm, an Ar flow rate from about 80 to 150 sccm, oxygen with a flow rate between about 8 and 15 sccm, applying 0 to about 10 Amps direct current to at least one solenoid, a source power between 0 and about 200 W for the upper electrode, a cathode bias power from about 200 W to 300 W, a chamber pressure from about 25 to 40 mTorr, and a wafer pedestal temperature between about 10° C. and 40° C.

6. The method of claim 1 wherein stripping the BARC and remaining photoresist layer has a minimum time beyond end point signal of less than about 25% of the etch time up to the end point signal.

7. The method of claim 1 wherein stripping the BARC and remaining photoresist layer comprises an $O_2$ flow rate of about 800 to 1500 sccm, at least one solenoid with 0 to about 20 Amps direct current, a source power between about 1000 W and 2500 W to an upper electrode, a cathode bias power from about 50 W to 200 W, a chamber pressure between about 200 and 400 mTorr, and a wafer pedestal temperature between about 10° C. and 40° C.

8. The method of claim 1 wherein the wet clean treatment comprises:
   (a) a first step comprising a ST250 solution;
   (b) a second step that includes water cleaning with ultrasonic agitation; and
   (c) a third step comprising a ST250 solution.

9. The method of claim 8 wherein the ST250 solution in the first step is applied at a temperature between about 35° C. and 45° C. for a period of about 2 to 4 minutes and the ST250 solution in the third step is applied at a temperature between about 35° C. and 45° C. for a period of about 1 to 3 minutes.

10. The method of claim 8 wherein ultrasonic agitation is accomplished by applying a power of 0 W to about 200 W to the water solution for a period of about 1 to 3 minutes.

11. The method of claim 1 further comprised of a metallization step after the wet clean treatment to at least partially fill the via opening with a bottom electrode layer or a metal layer that contacts the copper layer in the substrate.

12. A method of fabricating thin metal via interconnects, comprising:
 (a) providing a substrate comprised of a copper layer formed in a first dielectric layer, said copper layer has a top surface that is coplanar with a top surface of the first dielectric layer;
 (b) depositing a thin single layer of interlayer dielectric (ILD) on the substrate;
 (c) sequentially forming a bottom anti-reflective coating (BARC) and a photoresist layer on the ILD;
 (d) forming a pattern in the photoresist layer comprised of a via opening that is aligned above a portion of the copper layer and exposes a portion of a top surface of the BARC;
 (e) performing a first reactive ion etch (RIE) process that removes the BARC layer exposed by the via opening, and removes a portion of the ILD layer that is exposed by etching the BARC layer; said first RIE process includes an initial end point detect signal and uncovers a portion of the copper layer below the via opening;
 (f) stripping the BARC and any remaining portions of the photoresist layer with an oxygen plasma in an etch chamber with a wafer pedestal temperature, DC bias, and minimum time beyond an end point signal that avoid copper oxidation and damage to copper; and
 (g) performing a wet clean treatment.

13. The method of claim 12 wherein the first dielectric layer is made of silicon oxide and the ILD is comprised of silicon nitride or silicon carbide and has a thickness from about 100 to 600 Angstroms.

14. The method of claim 12 wherein the first RIE process comprises a $CF_4$ flow rate between about 40 and 240 sccm, a $CHF_3$ flow rate from 0 to about 40 sccm, a $CHF_3/CF_4$ flow ratio from 0 to about 1:6, a chamber pressure from about 40 mTorr to 150 mTorr, a cathode bias power between about 150 W and 450 W, and a wafer pedestal temperature between about 10° C. and 40° C.

15. The method of claim 14 wherein the first RIE step further comprises a cathode bias power reduction to the range of 50 W to 200 W after the initial end point detect signal is observed.

16. The method of claim 12 wherein stripping the BARC and remaining photoresist layer comprises an $O_2$ flow rate of about 800 to 1500 sccm, at least one solenoid with 0 to about 20 Amps direct current, a source power between about 1000 W and 2500 W to an upper electrode, a cathode bias power from about 50 W to 200 W, a chamber pressure between about 200 and 400 mTorr, and a wafer pedestal temperature between about 10° C. and 40° C.

17. The method of claim 12 wherein the wherein the wet clean treatment comprises:
 (a) a first step comprising a ST250 solution;
 (b) a second step that includes water cleaning with ultrasonic agitation; and
 (c) a third step comprising a ST250 solution.

18. The method of claim 17 wherein the ST250 solution in the first step is applied at a temperature between about 35° C. and 45° C. for a period of about 2 to 4 minutes and the ST250 solution in the third step is applied at a temperature between about 35° C. and 45° C. for a period of about 1 to 3 minutes.

19. The method of claim 17 wherein ultrasonic agitation is accomplished by applying a power of 0 W to about 200 W to the water solution for a period of about 1 to 3 minutes.

20. The method of claim 12 further comprised of a metallization step after the wet clean treatment to at least partially fill the via opening with a bottom electrode layer or a metal layer that contacts the copper layer in the substrate.

* * * * *